United States Patent
Rees et al.

(10) Patent No.: US 7,843,979 B2
(45) Date of Patent: Nov. 30, 2010

(54) DAMPING OF PARASITIC RESONANCE USING A RESISTIVE PARALLEL CONDUCTOR

(75) Inventors: Theodore D. Rees, Mountain View, CA (US); Zhong Li, Campbell, CA (US)

(73) Assignee: Intersil Americas Inc., Milpitas, CA (US)

( * ) Notice: Subject to any disclaimer, the term of this patent is extended or adjusted under 35 U.S.C. 154(b) by 599 days.

(21) Appl. No.: 11/394,440

(22) Filed: Mar. 31, 2006

(65) Prior Publication Data

US 2006/0227828 A1  Oct. 12, 2006

Related U.S. Application Data

(60) Provisional application No. 60/669,827, filed on Apr. 8, 2005.

(51) Int. Cl.
*H01S 3/00* (2006.01)
(52) U.S. Cl. .................. 372/38.02; 372/38.07

(58) Field of Classification Search ........... 372/38.02
See application file for complete search history.

(56) References Cited

U.S. PATENT DOCUMENTS

| 5,732,097 A * | 3/1998 | Yamaguchi et al. ...... 372/38.07 |
| 2004/0202215 A1* | 10/2004 | Fairgrieve ................ 372/38.02 |

* cited by examiner

*Primary Examiner*—Minshun Harvey
*Assistant Examiner*—Xnning Niu
(74) *Attorney, Agent, or Firm*—Fliesler Meyer LLP

(57) ABSTRACT

Circuits and methods for damping out parasitic resonance within a packaged integrated circuit (IC) are provided. A conductive path including a resistor and a conductor is added in parallel with a conductive path that provides power to components within a die of the packaged IC. When implemented in a packaged laser driver integrated circuit (IC), a conductive path including a resistor and a conductor in placed in parallel with a conductive path that provides a laser driver output, of the packaged laser driver IC, to a laser diode. This abstract is not intended to be a complete description of the various embodiments of the present invention.

19 Claims, 15 Drawing Sheets

DAMPING OF PARASITIC RESONANCE USING A RESISTIVE PARALLEL CONDUCTOR

PRIORITY CLAIM

The present application claims priority under 35 U.S.C. 119(e) to U.S. Provisional Patent Application No. 60/669,827, filed Apr. 8, 2005, which is incorporated herein by reference.

FIELD OF THE INVENTION

The present invention relates methods and circuits that are used to reduce, and preferably eliminate, unwanted overshooting and ringing caused by the combination of capacitance and parasitic inductance.

BACKGROUND OF THE INVENTION

Within a packaged integrated circuit (IC), the power and ground typically have a capacitance between them due to added small capacitors, and the sum of various transistor features. This capacitance can exceed several hundred pico farads (pF), depending on the chip size and design. In the typical case, the silicon is bonded out to the package pins with thin gold bonding wires that are usually about 1 mm in length. These bonding wires will have an inductance of about 1 nH/mm. So a typical IC will have the chip ground separated from the outside ground by about 1 nH, and the chip power separated from the external power (e.g., VCC) by about 1 nH. Outside of the circuit, the power and ground are typically connected together through a large decoupling capacitor (e.g., 0.1 uF). The trace going from the chip VCC pin to the decoupling capacitor, the decoupling capacitor itself, and the trace from the other end of the decoupling capacitor to the chip ground constitute another parasitic inductance between the VCC and GND pin external to the package. Together with 200 pF of internal chip capacitance from VCC to GND, a resonant tank is formed, with a resonant frequency of about 250 MHz in this example. Often, resonances from about 100 MHz to 200 MHz are seen, depending on the size of the loop capacitance and inductance.

The above described resonance causes problems within high frequency chips. For example, when the power supply current is varied by the circuit activity, the chip power will ring at the resonant frequency as a result. This will cause the chip ground to ring, as well as the chip power, and can be a source of electromagnetic interference (EMI) problems. In addition, the ringing can pollute the signals within the chip, and in severe cases cause the chip to oscillate or misbehave in some other manner.

A potential solution is to use resistors in series with internal decoupling capacitors to try to damp out this problem. While this helps, it is not always an acceptable solution. Additionally, there are some capacitors that may not lend themselves to having a series resistor, and the series resistor destroys the ability of the capacitor to decouple above the RC frequency of the solution. Thus, if the resistor is chosen to limit resonance at 150 MHz, above 150 MHz the capacitor looks like a resistor, instead of providing ever more protection against supply variation.

Accordingly, there is a need to overcome the above discussed problems of the insufficiently damped parasitic resonant circuit.

SUMMARY OF THE INVENTION

Embodiments of the present invention relate to circuits and methods for damping out parasitic resonance associated with a packaged integrated circuit (IC). In accordance with specific embodiments of the present invention, this is accomplished by adding a conductive path including a resistor and a conductor in parallel with a conductive path that provides power to components within a die of the packaged IC. Such a conductor can include, e.g., at least one of a bond wire and a trace. The resistor can be added within the die of the packaged IC. Alternatively, the resistor can be added outside the packaged IC.

In accordance with a preferred embodiment, the added conductive path that includes the resistor and conductor is shorter than the conductive path that provides power to components within the die. In accordance with specific embodiments, the conductive path including a resistor and a conductor is a resistive conductor. In accordance with specific embodiments, the resistor is an adjustable resistor that allows for fine tuning of the damping.

In accordance with specific embodiments of the present invention, parasitic resonance associated with a packaged laser driver IC is damped out by placing a conductive path including a resistor and a conductor in parallel with a conductive path that provides a laser driver output, of the packaged laser driver IC, to a laser diode. Such a resistor can be added within the die of the packaged laser driver IC, or added outside the packaged laser driver IC. It is also possible that the conductive path including the resistor and conductor is a resistive conductor. Preferably, the damping conductive path that includes the resistor and conductor is shorter than the conductive path that provides the laser drive output to the laser diode. Again, the resistor can be an adjustable resistor that allows for fine tuning of the damping.

This summary is not intended to be a complete description of the various embodiments of the present invention. Further and alternative embodiments, and the features, aspects, and advantages of the present invention will become more apparent from the detailed description set forth below, the drawings and the claims.

DETAILED DESCRIPTION

The following detailed description of the present invention refers to the accompanying drawings that illustrate exemplary embodiments consistent with this invention. Other embodiments are possible, and modifications may be made to the embodiments within the spirit and scope of the present invention. Therefore, the following detailed description is not meant to limit the invention. Rather, the scope of the invention is defined by the appended claims. Throughout the figures, similar elements are labeled in a similar manner. It is also noted that elements and distances in the figures are not necessarily drawn to scale.

In electrical engineering, inductance is often used to model the relationship between changing current and voltage. For parasitic inductance, which is the inductance associated with wires and/or traces making up a circuit's connections, the DC inductance can be modeled by computing the magnetic field over all space associated with a given loop current flow, and equating the energy of this magnetic field to the energy stored in an inductor. As circuit speed increases and circuit distances increase, this DC inductance calculation seems like it might not suffice to model the effect of parasitic inductance because the speed of light is involved in establishing the magnetic field. Nevertheless, this lack of precision can be ignored in the modeling for the sake of explaining the effects in the familiar terms of circuit inductance. For those cases where the transmission distance is large relative to the circuit speed, the DC inductance can usually be subdivided into segments, parallel capacitive elements can be added between inductive segments and a transmission model can be produced instead of a finite element model solving Maxwell's equations directly. Given that, a simple explanation of the invention is provided below.

Figure 1:
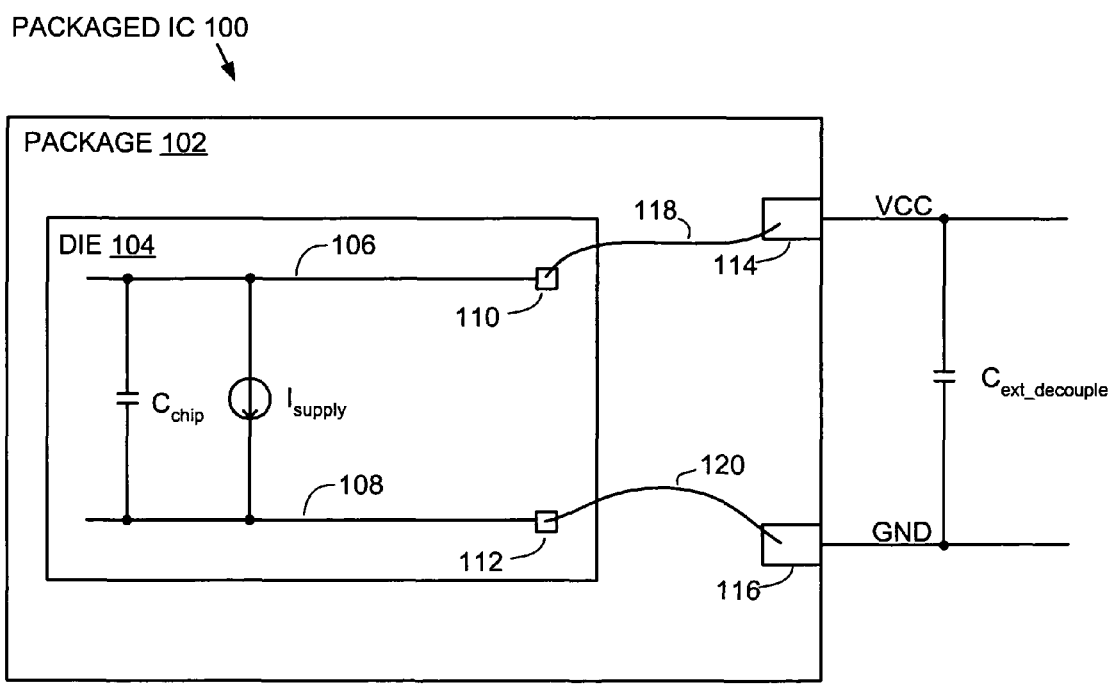
FIG. 1 is a high level diagram of an IC without damping on the power supply.

In FIG. 1, a model of a packaged integrated circuit (IC) 100 without damping on the power supply (VCC) is shown. The model is shown as including a die 104 within a package 102, which together form the packaged IC 100. The die 104 is shown as including a supply current ($I_{supply}$) connected between a high rail 106 and a low rail 108, and a chip capacitance ($C_{chip}$) in parallel with the supply current ($I_{supply}$). The high rail 106 within the die 104 is connected to a bond pad 110, and the low rail 108 within the die 104 is connected to a further bond pad 112. The package 102 is shown as including two pins 114 and 116, one to connect to an external power supply (e.g., VCC) and the other one to connect to an external ground (GND) or an external low rail voltage (e.g., −VCC). Also shown is that each of the bond pads 110 and 112 within the die 104 is connected by a corresponding bond wire 118 and 120 to the corresponding pin 114 and 116 of the package 102.

The chip capacitance ($C_{chip}$) is formed by the transistor parasitics within the packaged IC 100, and thus, may also be referred to as the parasitic capacitance. The circuit parasitic inductance is composed of the loop of chip trace segments, bond wires, external trace segments, and inductance of the external decoupling capacitor ($C_{ext\_decouple}$). In practice, the chip capacitance ($C_{chip}$) is distributed in a complex way over the surface of the die, and there is shunt capacitance off of all of the trace segments. In spite of this complication, the first resonance behaves a lot like a simple lumped capacitance equal to the sum of all the die capacitances, and a lumped inductance composed of the loop inductance.

The current in the packaged IC 100 normally has some fast switching components associated with the normal activity of doing whatever the chip is supposed to do. These fast current changes in the die flow in a loop according to Kirchoffs law. There is an additional supply and ground trace beyond the circuit shown, but for the resonant condition, they are not so important. Although there are some parasitic damping elements associated with these parasitic capacitances and inductances, they typically are not sufficient to dampen the LC resonance seen by the supply current. As a result, the impedance at resonance can exceed ten's of ohms. This can create large voltage swings on the supply and ground lines relative to any particular reference point. For instance, even if only 100 mA of supply currents changes quickly on a circuit with over 10 ohms of parallel resonance, the ringing component on the VCC and GND lines can exceed one volt.

Figure 2:
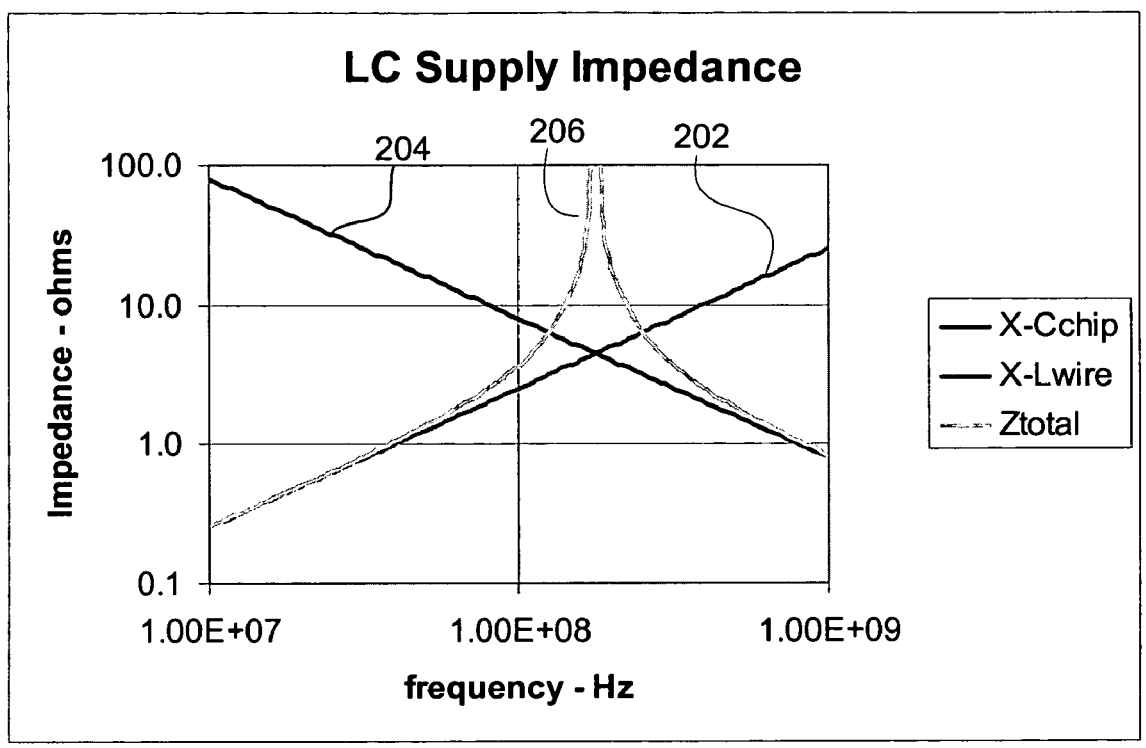
FIG. 2 is a graph of the impedance seen by the supply current for the packaged IC of FIG. 1.

The impedance seen by the supply current ($I_{supply}$) of FIG. 1 is shown in the bode plot of FIG. 2. In the bode plot, frequency in log scale is shown along the horizontal axis (i.e., the x-axis), and impedance in log scale is shown along the vertical axis (i.e., the y-axis). The line 202 that goes from the lower left to the upper right corresponds to the loop parasitic inductance, which includes inductances of the conductors 118 and 120, the external VCC and GND traces and the inductance of the external decoupling capacitor ($C_{ext\_decouple}$). Because the capacitive reactance of the external decoupling capacitor ($C_{ext\_decouple}$) is very small at the resonant frequency, it can be ignored. The line 204 that goes from the upper left to the lower right corresponds to the chip capacitance. The line 206, which corresponds to the total impedance seen by the supply current, includes a peak near the center of the plot that illustrates that at a resonant frequency there is a large peak in the impedance, which is undesirable. At frequencies below the resonant frequency, the loop parasitic inductance will define the impedance seen by the supply current (also known as a "current source"). At frequencies above the resonant frequency, the chip capacitance will define the impedance seen by the supply current. And, as mentioned above, at the resonant frequency, and frequencies close to the resonant frequency, the impedance seen by the supply current can increase dramatically due to the resonance. Embodiments of the present invention, explained below, reduce this spike.

As mentioned above, a potential solution is to use a resistor in series with an internal decoupling capacitor to try to damp out this problem. For example, in FIG. 3, the packaged IC 300 is shown as including, in parallel with the chip capacitance ($C_{chip}$), and in parallel with the supply current ($I_{supply}$), an additional capacitor ($C_{int\_decouple}$) with series resistor (R) added within the packaged IC 300. The capacitor and resistor may be collectively referred to as an internal RC snubber 301 (also known as an internal RC dampener 301).

Figure 3:
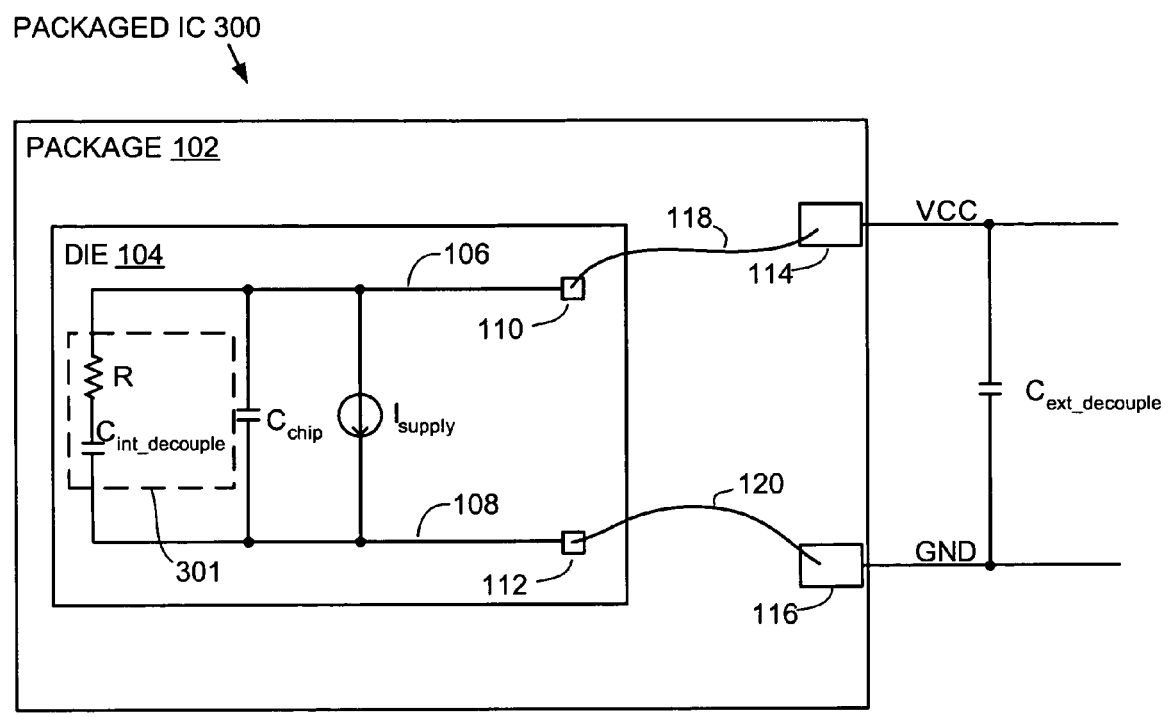
FIG. 3 is a high level diagram of an IC that is similar to the one in FIG. 1, but with an additional capacitor with series resistor (known as an RC snubber) added within the packaged IC.
Figure 4:
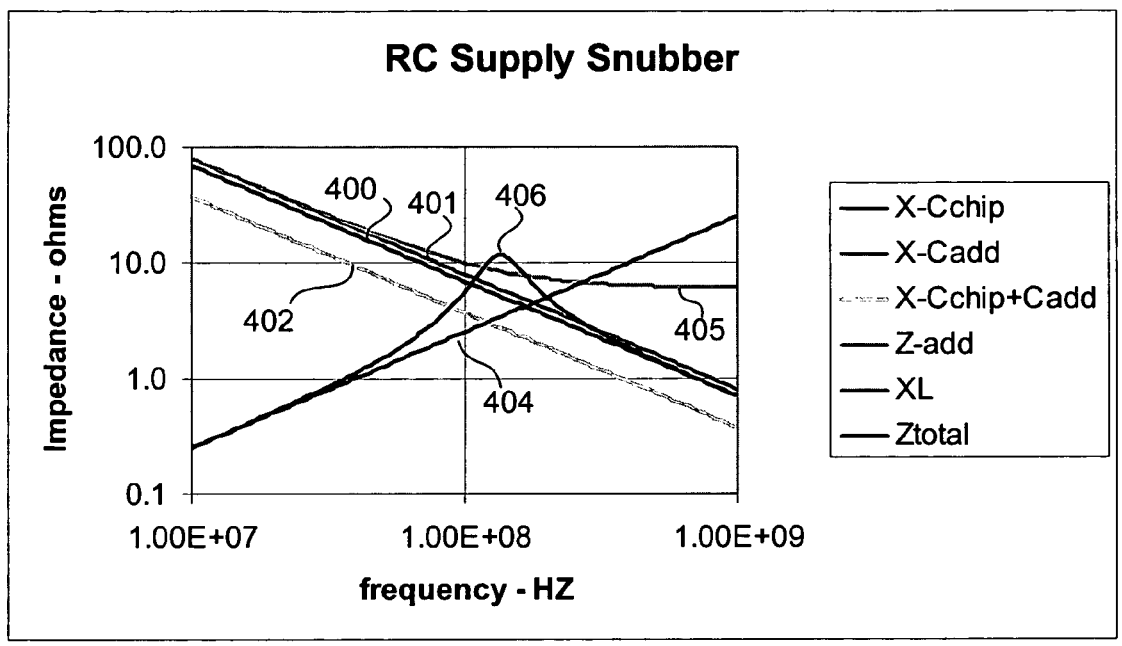
FIG. 4 is a graph of the impedance seen by the supply current for the packaged IC of FIG. 3.

The impedance seen by the supply current ($I_{supply}$) of FIG. 3 is shown in FIG. 4. The line 400 corresponds to the reactance of the chip capacitance $C_{chip}$; the line 401 corresponds to the reactance of the added capacitor $C_{int\_decouple}$; and the line 402 corresponds to the combined reactance of the chip capacitance and the added capacitor. The line 404 that goes from the lower left to the upper right corresponds to the reactance of the loop inductance seen by the supply current ($I_{supply}$). The line 405 corresponds to the impedance of the added internal RC snubber 301. The line 406 corresponds to the total impedance seen by the supply current. At low frequencies, the loop inductance remains the main limitation to the supply impedance. At the resonant frequency (lowered by the added capacitance), the high Q is reduced because the added resistor provides energy absorption. At high frequencies, the impedance is as it was in the undamped configuration. Thus, the added RC has provided a benefit primarily in Q reduction. However, the price (e.g., cost and chip real estate) of adding an on-chip capacitance is usually quite high, and thus not preferred.

Figure 5A:
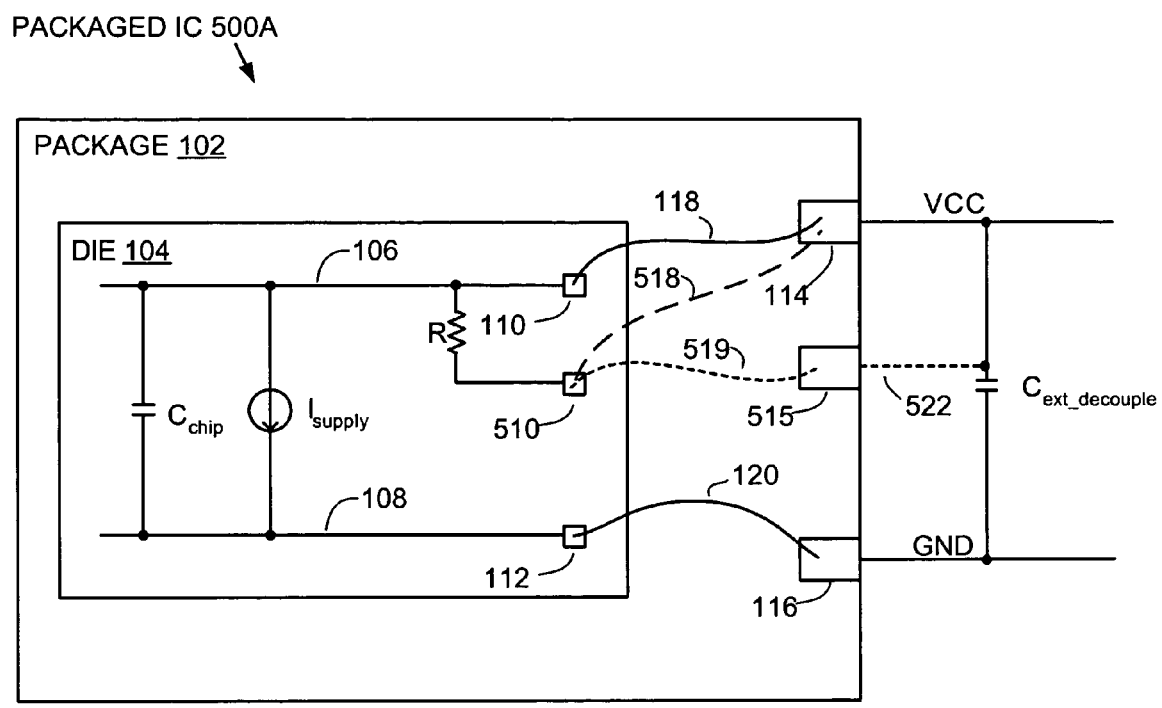
FIG. 5A is a high level diagram of an IC with an additional resistor and supply bond wire added within the packaged IC, according to an embodiment of the present invention.

In accordance with an embodiment of the present invention, damping is accomplished by connecting a resistor and conductor (e.g., trace and/or bond wire) in parallel with the conductor (e.g., trace and/or bond wire) that connects the supply current to the external power decoupling capacitor. More specifically, in one embodiment, a resistor (R) is added within the die 104 between the high rail 106 and a further bond pad 510, as shown in FIG. 5A. This further bond pad 510 can be connected by a conductor (e.g., a bond wire) to the external power pin 114, as shown by the upper dashed line 518 in FIG. 5A. Alternatively, and preferably, if an extra pin 515 is available in the package 102, then the further bond pad 510 is connected to its own pin 515, as shown by the lower dashed line 519 in FIG. 5A. When the extra pin 515 is used, the extra pin is connected to the external power decoupling capacitor (e.g., VCC) by a conductor 522 (e.g., by a trace connection). Having the extra pin 515 is preferred because of the considerable inductance in the trace from the package pin 114 to the decoupling capacitor ($C_{ext\_decouple}$). Preferably a separate trace (i.e., 522) extends all the way to the decoupling capacitor ($C_{ext\_decouple}$).

Figure 5B:
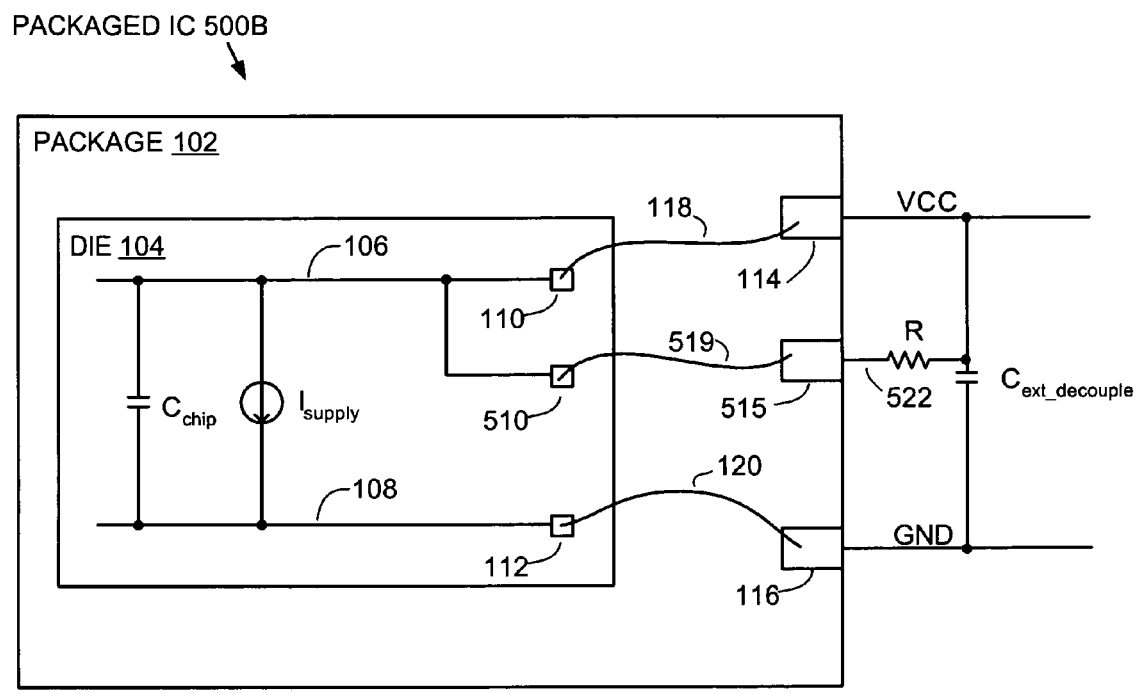
FIG. 5B is similar to FIG. 5A, but with the resistor located outside the packaged IC, in accordance with an embodiment of the present invention.

In FIG. 5A, the resistor (R) is shown as being located inside of the packaged IC 500A, but it could also be external to the packaged IC, as shown with IC 500B in FIG. 5B.

It is preferred that the new bond wire 518 or 519 is sufficiently separated from the original supply bond wire 118 so that their inductances are separate (i.e., mutual inductances should be avoided). It also preferred that the added resistor (R) is in series with the shorter bond wire (so long as the circuit will operate correctly with the larger bond wire at the lower frequencies). Generally, the shorter a conductive path the less inductance, and the resistor is preferably in the conductive path with lower inductance. Accordingly, it is preferred that the resistor is in the shorter path.

Figure 6:
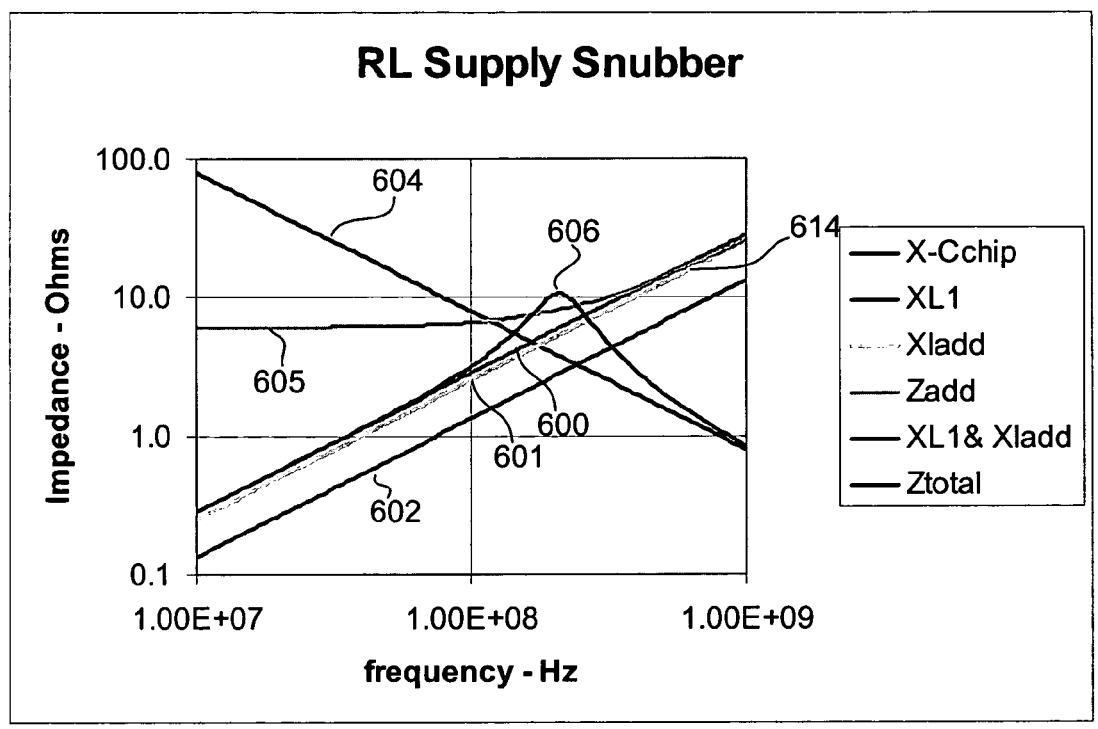
FIG. 6 is a graph of the impedance seen by the supply current for the packaged IC of FIG. 5A.

The impedance seen by the supply current is shown in FIG. 6. The line 600 corresponds to the reactance of the original inductance associated with path 118; the line 601 corresponds to the reactance associated with the added path 519; and the line 602 corresponds to the reactance of the combined circuit with the original inductance and the added inductance in parallel. The line 604 that goes from the upper left to the lower right corresponds to the reactance of the chip capacitance. The line 605 corresponds to the impedance of the added path 519 and it's series resistance. The line 606 corresponds to the total impedance seen by the supply current. At low frequencies, the impedance is the inductance of the wire 118 without the added resistor (R). At high frequencies, the impedance is limited by the chip capacitance as before (line 604). At the resonant frequency (which is raised by the reduced parallel inductance), the Q is reduced by the added resistor (R). It should be mentioned again that the effectiveness of this solution depends also on the trace connections outside of the packaged IC. In particular, preferably there should be separate traces all the way to and from the external decoupling capacitor ($C_{ext\_decouple}$). Otherwise, the circuit inductance could be dominated by the external inductance.

In accordance with specific embodiments of the present invention, the path that includes the resistor (R) and conductor (e.g., bond wire and/or trace) can simply be a resistive conductor. In other words, the bond wire and/or trace (that is added in parallel with the conductive path that provides power to components within a die of the packaged IC) can be made from a conductor with high electrical resistance, thereby eliminating the need for a separate component.

Figure 7:
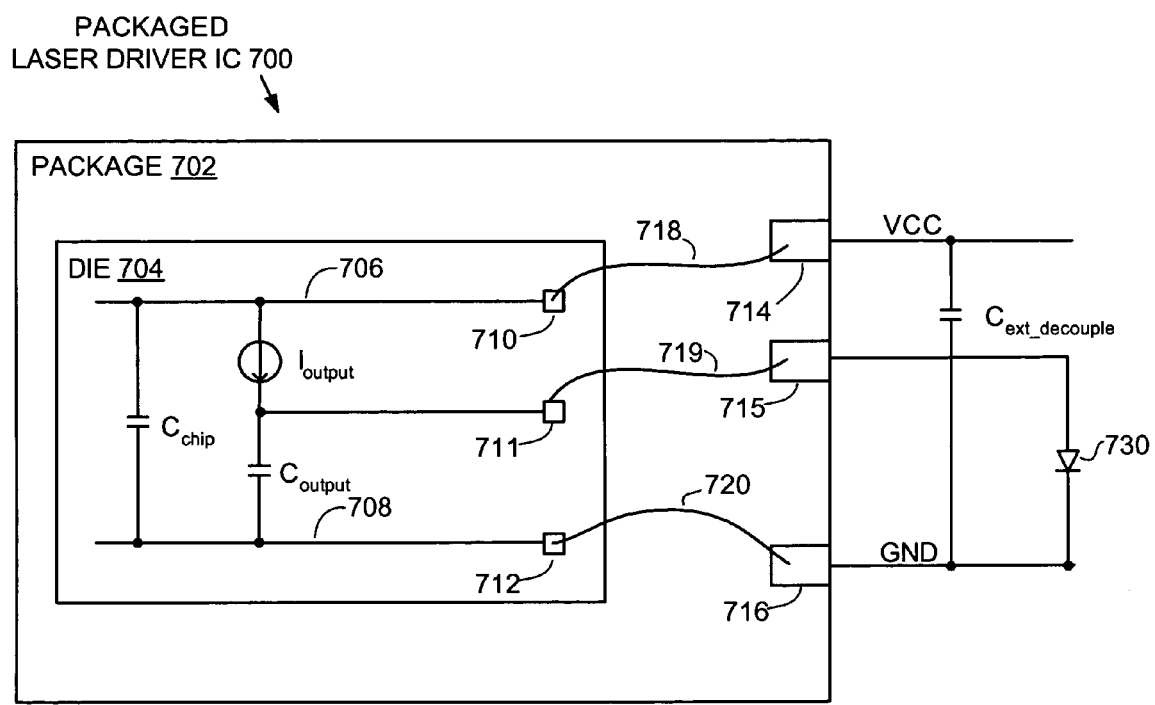
FIG. 7 a high level diagram illustrating a typical use of a packaged IC to drive a laser diode.

FIG. 7 illustrates a model of a laser driver IC 700, which is shown as including a die 704 within a package 702. The die 704 is shown as including an output current ($I_{output}$) in series with a driver output capacitance ($C_{output}$) connected between a high rail 706 and a low rail 708. The output current may also be referred to as a drive current or drive signal. In parallel with the output current ($I_{output}$) and output capacitance ($C_{output}$) is a chip capacitance ($C_{chip}$). Also shown are three bond pads 710, 711 and 712 within the die 704. The package 702 is shown as including three pins 714, 715 and 716, one to connect to an external power supply (e.g., VCC), one that provides the drive current to a laser diode 730, and one to connect to an external ground (GND) or an external low rail voltage (e.g., −VCC). Also shown is that each of the bond pads 710, 711 and 712 within the die 704 is connected to a corresponding pin 714, 715 and 716 of the package 702 (e.g., by a corresponding bond wire 718, 719 and 720).

Still referring to FIG. 7, an example of the use of a parasitic resonance is shown for the drive signal ($I_{output}$) on a flex circuit or printed circuit board (PCB), which connects the laser driver IC 700 to the laser diode 730. The output current ($I_{output}$) sees a bridge circuit. One side of the bridge is composed of $C_{output}$ in series with $C_{chip}$. The other side of the bridge is composed of the path through wire 719, the laser diode 730, $C_{ext\_decouple}$ and wire 718. The wire 720 crosses between the two sides of the bridge. Taken together the bridge impedance is composed of the capacitive side in parallel with the mostly inductive side of the bridge, and has the potential to have a bad resonance.

Figure 8:
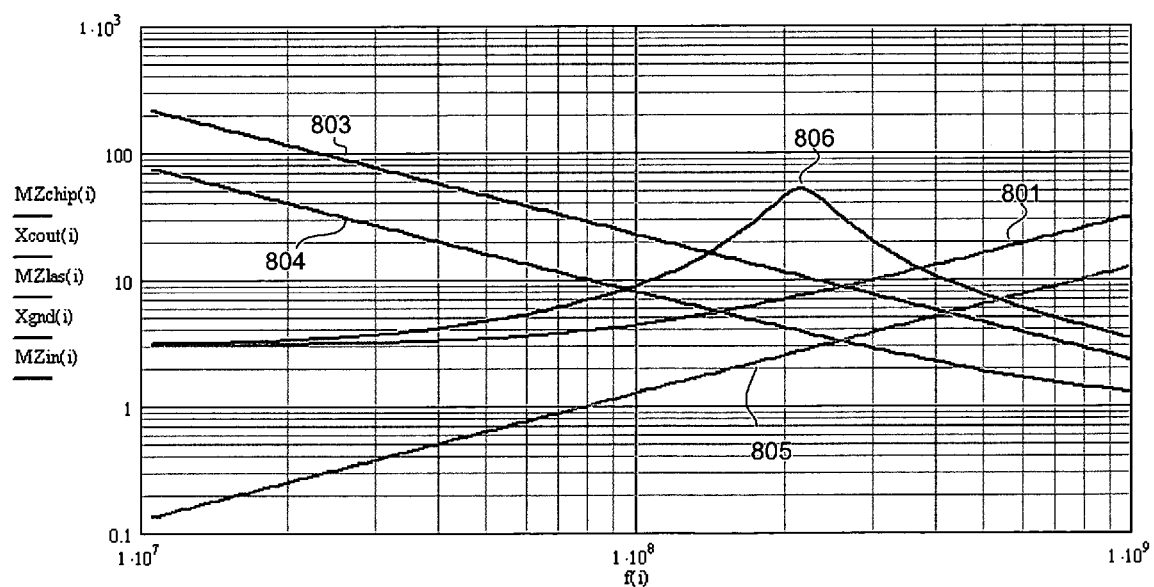
FIG. 8 is a graph of the impedance seen by the output current loop for the packaged IC of FIG. 7.

The impedance seen by the output current ($I_{output}$) of FIG. 7 is shown in FIG. 8. The line 804 that goes from the upper left to the lower right corresponds to the impedance of the chip capacitance ($C_{chip}$). The line 803 that goes from the upper left to the lower right corresponds to the reactance of the output capacitor ($C_{out}$). The line 801 corresponds to the impedance of the laser diode, which includes laser inductance and resistance. The line 805 corresponds to the reactance of the ground bond wire 720. The line 806 corresponds to the total impedance seen by the output current ($I_{output}$). The main damping element in this circuit is the laser diode resistance, which can be less than enough to prevent a high Q circuit. There are obviously other examples where a current source sees a lumped capacitance that resonates against various trace inductances with insufficient damping.

Figure 9:
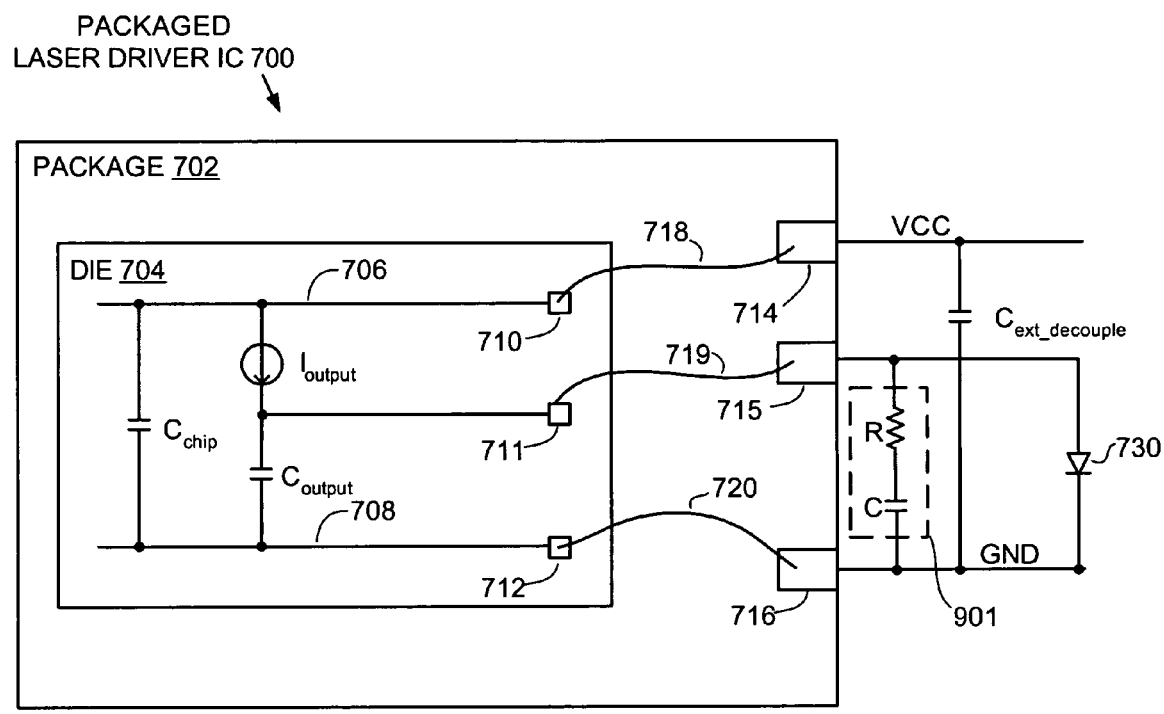
FIG. 9 is a high level diagram illustrating a typical use of an external RC snubber for a laser driver.
Figure 10:
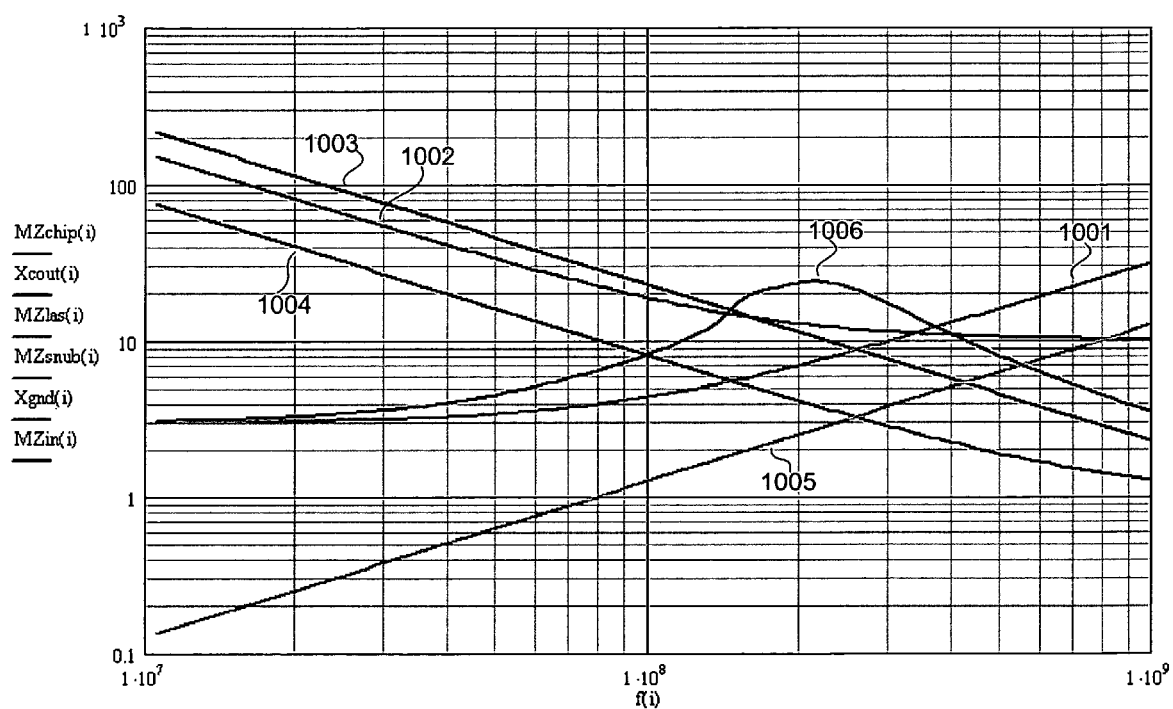
FIG. 10 is a graph of the impedance seen by the output current loop for the packaged IC and RC snubber of FIG. 9.

FIG. 9 illustrates the use of an external RC snubber 901 (also known as an RC dampener 901) for the laser driver 700. The impedance plot for FIG. 9 is shown in FIG. 10. The line 1004 that goes from the upper left to the lower right corresponds to the impedance of the chip capacitance ($C_{chip}$). The line 1003 that goes from the upper left to the lower right corresponds to the reactance of the output capacitor ($C_{out}$). The line 1001 corresponds impedance of the laser diode, which includes laser inductance and resistance. The line 1002 corresponds to the impedance of the added capacitor and added resistor of the RC snubber 901. The line 1005 corresponds to the reactance of the ground bond wire 720. The line 1006 corresponds to the total impedance seen by the output current ($I_{output}$). While this type of damping is effective in removing overshoot and ringing, it has the penalty of reducing the speed of the circuit (e.g., slowing down the rise time) due to the added capacitance.

Figure 11A:
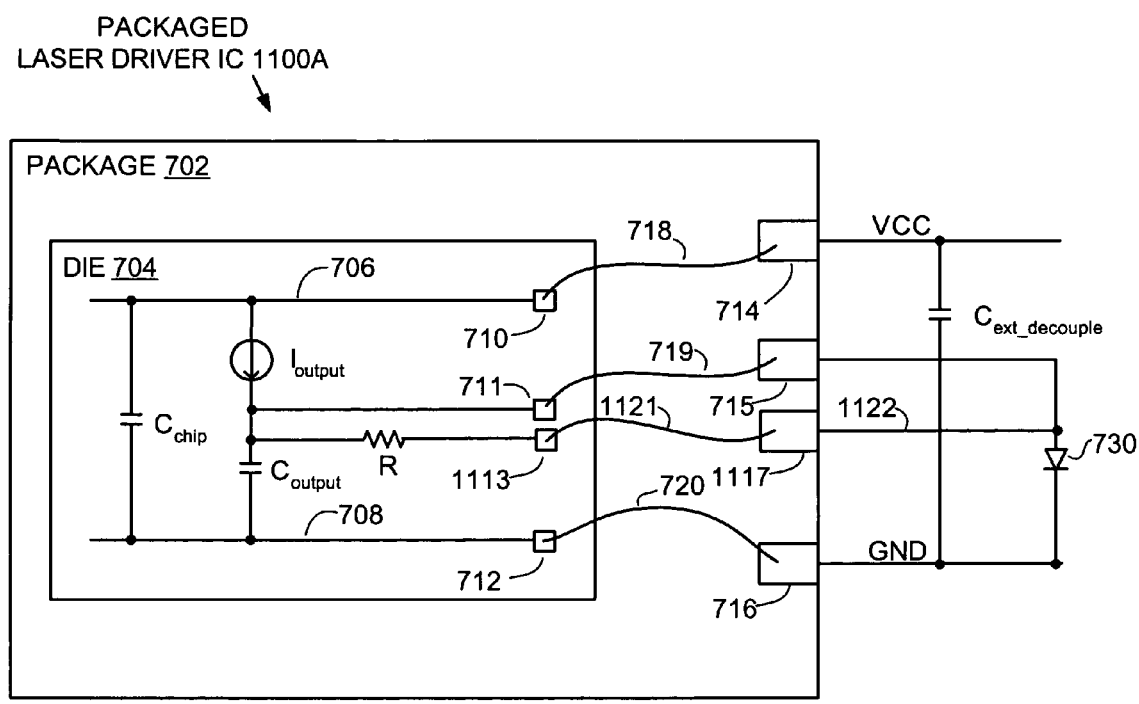
FIG. 11A is a high level diagram illustrating an exemplary use of an RL snubber for a laser driver, with the resistor located within the packaged laser driver IC, in accordance with an embodiment of the present invention.
Figure 11B:
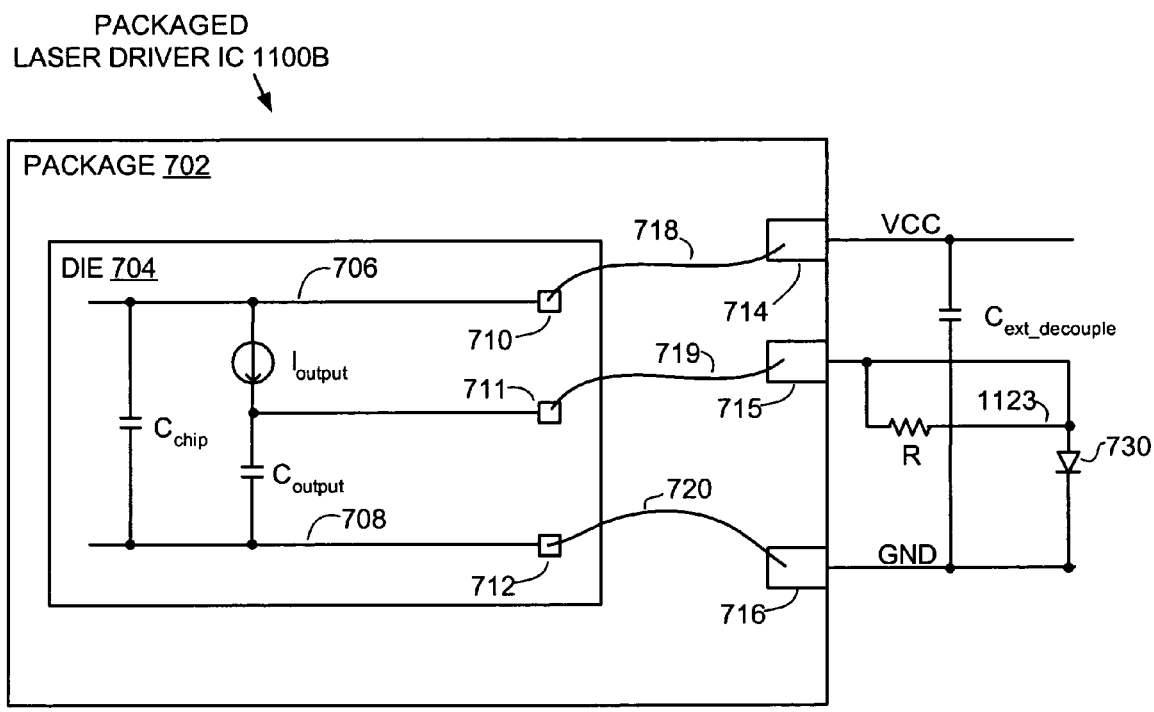
FIG. 11B is similar to FIG. 11A, but with the resistor located outside the packaged laser driver IC, in accordance with an embodiment of the present invention.

In accordance with an embodiment of the present invention, damping of the laser driver output current ($I_{output}$) is accomplished by connecting a resistor (R) and conductors 1121 and 1122 (e.g., trace(s) and/or bond wire(s)) in parallel with the conductor 719 (e.g., trace(s) and/or bond wire(s)) that connects the laser drive output current ($I_{output}$) to the anode of the laser diode, as shown in FIG. 11A. This resistor (R) and conductors 1121 and 1122 can be considered an RL snubber. In FIG. 11A, the resistor (R) is shown as being located inside of the packaged IC, but it could also be external to the packaged IC as shown in FIG. 11B, because usually most of the loop inductance is in the trace between the packaged IC and the laser diode 730. In FIG. 11B, the resistor (R) and conductor 1123 can be considered the RL snubber.

Figure 12:
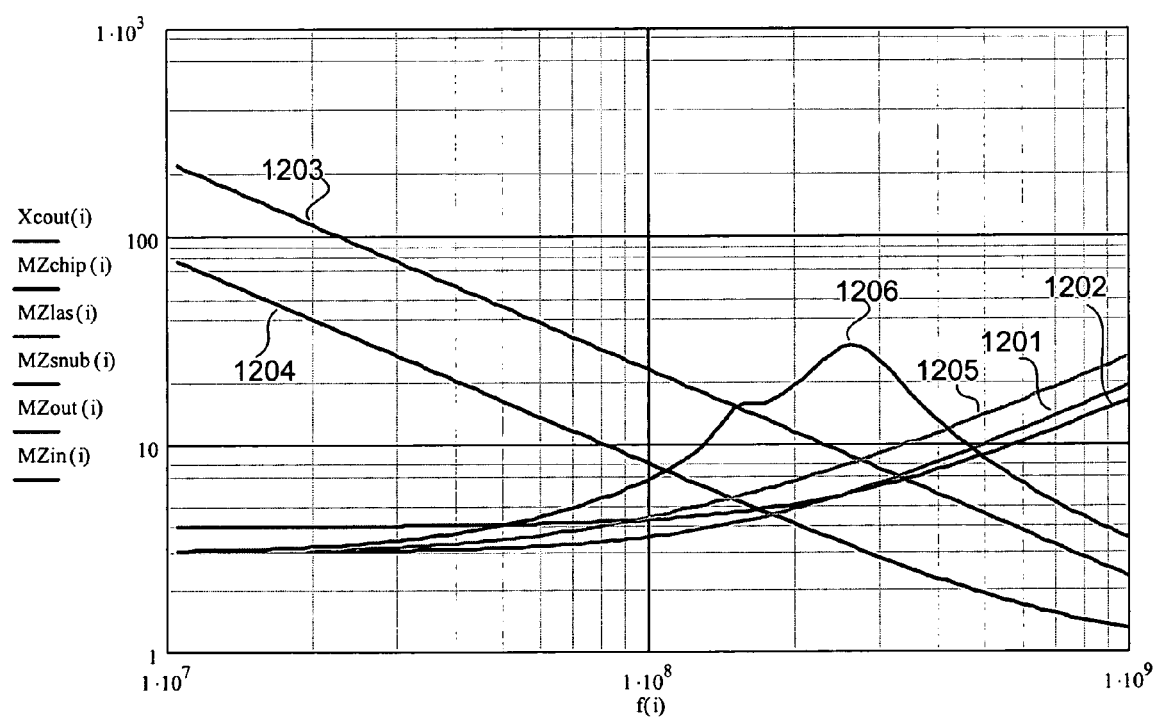
FIG. 12 is a graph of the impedance seen by the seen by the output current in the packaged IC of FIG. 11A.

The impedance plot for FIG. 11A is shown in FIG. 12. The line 1204 that goes from the upper left to the lower right corresponds to the impedance of the chip capacitance ($C_{chip}$). The line 1203 that goes from the upper left to the lower right corresponds to the reactance of the output capacitor ($C_{out}$). The line 1201 corresponds impedance of the laser diode, which includes laser inductance and resistance. The line 1202 corresponds to the impedance of the path including the resistor R and conductor 1121 (i.e., the impedance of the LR snubber). The line 1205 corresponds to the impedance of the LR snubber in parallel with the series combination of the inductance of line 719 and laser diode impedance. The line 1206 corresponds to the total impedance seen by the output current ($I_{output}$). Here the resonance is not only damped, but the frequency is raised. Thus the rise time is improved while the overshoot is reduced.

In accordance with specific embodiments of the present invention, the path that includes the resistor (R) and conductor (e.g., bond wire and/or trace) can simply be a resistive conductor. In other words, the bond wire and/or trace (that is added in parallel with the conductive path that provides the output current to the laser diode) can be made from a conductor with high electrical resistance, thereby eliminating the need for a separate component.

Figure 13A:
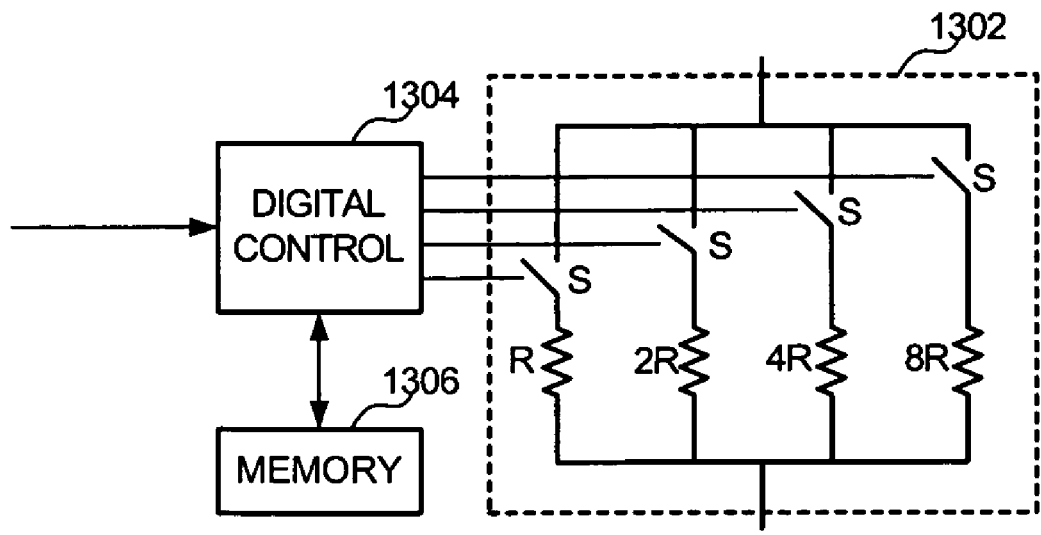
FIGS. 13A and 13B illustrate that the resistor used for damping can be an adjustable resistor, in accordance with embodiments of the present invention.

It may be difficult to determine the optimal value for resistor (R), since it may be difficult to calculate the precise parasitic inductance and/or capacitance for a circuit. To overcome this, in accordance with specific embodiments of the invention, the resistor (R) can be an adjustable resistor. For example, the adjustable resistor (R) can include a resistor bank 1302, as shown in FIG. 13A. The resistor bank 1302 can include a plurality of selectable resistors in parallel. For example, each resistor includes a respective switch S (e.g., a switching transistor), as shown in FIG. 13A. Each resistor can have the same resistance, or more likely, each resistor is differently weighted to provide for a wider range of possible resistances. The resistors can be weighted in a progressive fashion (e.g., R, 2R, 3R, 4R), a binary fashion (e.g., R, 2R, 4R, 8R), or in any other arrangement. The use of four resistors is only an example. More or less resistors can be included in the resistor bank 1302.

In accordance with an embodiment of the present invention, a digital controller 1304 (e.g., within the packaged IC) receives a digital control signal that specifies which resistor(s) (e.g., within the resistor bank 1302) are to be selected (e.g., which switches are to be closed) in FIG. 13A. Alternatively, a digital control signal specifies a desired resistance, and then the digital controller 1304 determines and selects the appropriate resistors to achieve the desired resistance (or the closest to the desired resistance as possible). In a silicon based solution, a weighted resistor DAC (similar to resistor bank 1302) is one of several schemes that can be used to provide the adjustable resistor (R). In each of these embodiments, the digital controller 1304 can control the adjustable resistor (e.g., resistor bank 1302). For example, the digital controller 1304 closes the appropriate switches S in the resistor bank 1302 to achieve the desired resistance.

Figure 13B:
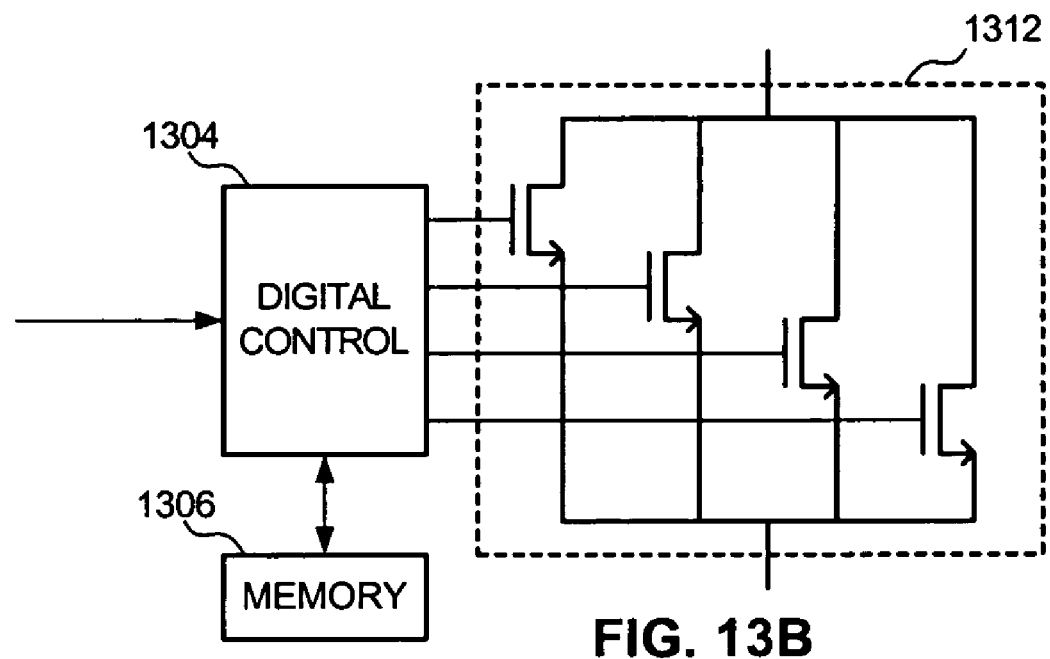

In accordance with an embodiment of the present invention, the adjustable resistor (R) includes a bank of transistors 1312 (e.g., CMOS transistors), as shown in FIG. 13B. A digital controller 1304 can apply appropriate gate voltage to achieve the desired damping. Alternatively, or additionally, the transistor bank 1312 can include transistors of different sizes that can be used to achieve a broad range of resistances and capacitances. It is also possible to simply metalize the IC resistors by trial and error to obtain the best value of resistance, thus eliminating the need for a controller.

Solutions of the present invention are counter-intuitive. More specifically, it would generally be thought that connecting a resistor in parallel with a very low resistance conductor (e.g., trace) wouldn't do anything. The concept is to run a second trace to the laser diode to provide an ideal voltage for the added parallel resistor. Preferably the added conductive path (e.g., trace(s) and/or bond wire(s)) has substantially zero ohms at DC, but at the frequency of interest, it acts as lossy inductor with a measurable (e.g., j15 ohms) reactive impedance.

In accordance with embodiments of the present invention, the original conductive path (e.g., trace and/or bond wire) and the added conductive path with a resistor preferably form independent inductors. Additionally, the resistor is preferably chosen against the resonant capacitor such that maximum damping is obtained. One can think of two inductors in parallel, both in parallel with a capacitor, so the combined inductance is about half of either one alone. But if a resistor is added to one inductor, at low frequencies that inductor simply acts as a resistor, while at high frequencies it acts as an inductor. During a brief frequency span of 2X, the combined inductors change from one inductor of value L to two inductors in parallel of value L/2. Within the interval, the combination resembles a resistor. Preferably, the resistor is selected so that this resistive region occurs at the resonant frequency. Thus a high Q resonance becomes a low Q resonance.

If unequal inductors are used, this effect can be enhanced. At low frequencies, assume L1 is the inductance of the large inductor. At high frequencies the resistance in series with L1 is not important, and the combined inductance (LT) is L1 is in parallel with L2, i.e., LT=[L1*L2/(L1+L2)]. By using a small value for L2, and a large value for L1, a wider range of frequency is achieved where the combination is resistive. One can think of three frequencies: $f_1$ where $X_{L1}$=R, and $f_2$ where $X_{L2}$=R, and $f_R$ where $X_{LT}$=XC. The R value is preferably adjusted so that fR is the geometric mean of $f_1$ and $f_2$.

In an integrated circuit solution, in according with an embodiment of the present invention, two or more bond wires can be used for each power supply to be damped. A similar effect can be obtained if the ground is double bonded. But if multiple supplies exist, there could be some cross interaction between the different power supplies when using the damped ground wire. It may not be necessary to use additional power and ground pins to reap some benefit. As long as the bond wires have some separation, some benefit can be obtained. However, the more independent the bond wire inductances are, the better. Sometimes, this is not an issue, at other times an IC is pad limited, or pin limited.

While the solutions of the present invention may not be ideal, they provide useful additions to the decoupling tools available for IC design. With these solutions, the capacitor can continue to reduce the impedance between supply and ground above the resonant frequency. But at low frequencies, the inductance from the die to the outside world is increased over what it would be if none of the parallel wires were blocked by a resistor. Since at low frequencies, the impedance of the inductance is small, this may be of less concern than the blockage of the capacitors reactance by series resistors. Also, this method could be used in conjunction with resistors in series with capacitors, developing some Q reduction with the resistive capacitors, and some with the resistive bond wire combination.

While a specific example was provided above for damping out parasitic resonance within a packaged laser driver integrated circuit (IC), embodiments of the present invention are useful for damping out parasitic resonance within other integrated circuits. For example, embodiments of the present invention can be used to damp the parasitic resonance within a power switching circuit. For other examples, embodiments of the present invention can be used to damp the parasitic resonance of circuits that drive a crystal, a coil, a diode, or anything else with a low impedance. More generally, embodiments of the present invention can be used to damp outputs that ring due to parasitic inductances and parasitic capacitance, or even with component inductances and/or capacitors.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. It is intended that the scope of the invention be defined by the following claims and their equivalents.

What is claimed is:

1. A method for use with a system including
    a packaged laser driver integrated circuit (IC),
    a laser diode, and
    a conductive path, in series with the laser diode, that provides a laser driver output, of the packaged laser driver IC, to one of two terminals of the laser diode,
    wherein the method, which is for damping the laser driver output of the packaged laser driver IC, comprises:
    inserting, in series with the laser diode, a further conductive path including a resistor and a conductor in parallel with at least a portion of the conductive path that provides the laser driver output, of the packaged laser driver IC, to one of two terminals of the laser diode.

2. The method of claim 1, wherein the conductor of the further conductive path comprises at least one of a bond wire and a trace.

3. The method of claim 1, wherein the resistor of the further conductive path is added within a die of the packaged laser driver IC.

4. The method of claim 1, wherein the resistor of the further conductive path is added outside the packaged laser driver IC.

5. The method of claim 1, wherein the further conductive path including the resistor and the conductor is shorter than the conductive path that provides the laser driver output to the one of two terminals of the laser diode.

6. The method of claim 1, wherein the further conductive path including the resistor and the conductor comprises a resistive conductor.

7. The method of claim 1, wherein the resistor included in the further conductive path comprises an adjustable resistor that allows for fine tuning of the damping.

8. A packaged laser driver integrated circuit (IC) having damped parasitic resonance and adapted to drive a laser diode, comprising:
    a first conductive path that provides a laser driver output, of the packaged laser driver IC, to one of two terminals of the laser diode, wherein said first conductive path is in series with the laser diode; and
    a second conductive path including a resistor and a conductor in parallel with at least a portion of said first conductive path, wherein said second conductive path is also in series with the laser diode.

9. The IC of claim 8, wherein the first conductive path has substantially no resistance at DC.

10. The laser driver IC of claim 8, wherein the conductor of the second conductive path comprises at least one of a bond wire and a trace.

11. The laser driver IC of claim 10, wherein the resistor of the second conductive path is added within a die of the packaged laser driver IC.

12. The laser driver IC of claim 10, wherein the resistor of the second conductive path is added outside the packaged laser driver IC.

13. The laser driver IC of claim 8, wherein the second conductive path including the resistor and the conductor is shorter than the first conductive path that provides the laser driver output to the one of two terminals of the laser diode.

14. The laser driver IC of claim 8, wherein the second conductive path including the resistor and the conductor comprises a resistive conductor.

15. The laser driver IC of claim 8, wherein the resistor of the second conductive path comprises an adjustable resistor.

16. The laser driver IC of claim 8, wherein the second conductive path including the resistor and the conductor provides an RL snubber.

17. The method of claim 1, wherein the step of inserting the further conductive path including the resistor and the conductor comprises inserting an RL snubber.

18. The method of claim 1, wherein the one of two terminals of the laser diode comprises an anode of the laser diode.

19. The laser driver IC of claim 8, wherein the one of two terminals of the laser diode comprises an anode of the laser diode.

* * * * *